United States Patent
Sone et al.

(10) Patent No.: US 9,148,968 B2
(45) Date of Patent: Sep. 29, 2015

(54) WATERPROOF MAIN TERMINAL

(71) Applicant: Mitsubishi Electric Corporation, Chiyoda-ku, Tokyo (JP)

(72) Inventors: Mitsuo Sone, Chiyoda-ku (JP); Hisakazu Yamane, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 93 days.

(21) Appl. No.: 14/042,903

(22) Filed: Oct. 1, 2013

(65) Prior Publication Data

US 2014/0332263 A1 Nov. 13, 2014

(30) Foreign Application Priority Data

May 7, 2013 (JP) ................................. 2013-097257

(51) Int. Cl.
  *H05K 5/00* (2006.01)
  *H05K 5/06* (2006.01)
  *H02G 3/08* (2006.01)

(52) U.S. Cl.
  CPC .............. *H05K 5/065* (2013.01); *H02G 3/088* (2013.01); *H05K 5/0069* (2013.01); *H05K 5/069* (2013.01)

(58) Field of Classification Search
  CPC ..................................................... H05K 5/069
  USPC .................................................. 174/560, 564
  See application file for complete search history.

(56) References Cited

U.S. PATENT DOCUMENTS

| | | |
|---|---|---|
| 2001/0014559 A1 | 8/2001 | Akimoto et al. |
| 2005/0083045 A1 | 4/2005 | Miyagawa |
| 2007/0084633 A1* | 4/2007 | Lee et al. .................. 174/564 |
| 2008/0072668 A1 | 3/2008 | Miyagawa |
| 2009/0049921 A1 | 2/2009 | Otsuka et al. |
| 2012/0228022 A1* | 9/2012 | Sawayanagi .............. 174/652 |

FOREIGN PATENT DOCUMENTS

| | | |
|---|---|---|
| JP | 54-131991 U | 9/1979 |
| JP | 61-197185 A | 9/1986 |
| JP | 01-272061 A | 10/1989 |
| JP | 05-135820 A | 6/1993 |
| JP | 06-012638 Y2 | 3/1994 |
| JP | 08-078087 A | 3/1996 |
| JP | 3446076 B2 | 9/2003 |
| JP | 2006-066216 A | 3/2006 |
| JP | 4089522 B2 | 5/2008 |
| JP | 4279262 B2 | 6/2009 |
| JP | 4453729 B2 | 4/2010 |
| WO | 2012165635 A1 | 12/2012 |

OTHER PUBLICATIONS

Japanese Office Action (Notification of Reason for Refusal); issued May 13, 0214 in Patent Application No. 2013-097257.

* cited by examiner

*Primary Examiner* — Hung V Ngo
(74) *Attorney, Agent, or Firm* — Sughrue Mion, PLLC

(57) ABSTRACT

When a housing of a waterproof main terminal is fixed onto the outside surface of a case with a screw, a through hole is sealed with a seal surface of a packing pressed onto the outside surface of the case. Furthermore, the elastic force of the packing placed so as to be in tight contact with the whole circumference of the terminal ensures high waterproofing performance between the terminal and the housing, so the one packing can perform waterproofing both between the case and the housing and between the terminal and the housing.

11 Claims, 8 Drawing Sheets

WATERPROOF MAIN TERMINAL

BACKGROUND OF THE INVENTION

1. Field of the Invention

The present invention relates to a waterproof main terminal screwed onto an electronic device case.

2. Description of the Background Art

In an electronic device used in a water-entering environment, such as within an engine room of a car, a waterproof main terminal is used to connect an electronic component within an electronic device case to an external device. For an electronic device handling large current, a waterproof main terminal made by insert-molding a metal terminal into a resin housing is often used to connect to an external device via a harness.

One example of conventional waterproof main terminals was an O-ring as presented in Patent Document 1 that is used for waterproofing between an electronic device case and housing of a waterproof main terminal screwed onto the case. Also, waterproofing is needed between a metal terminal and a resin housing because a gap may occur due to difference of linear expansion coefficient. A well known waterproofing method for this case is to apply a chemical agent to the metal terminal and perform edging to increase the creeping distance between the terminal, and the resin of the housing that are insert-molded. Another known method is to apply a special agent to the terminal to join the metal and the resin.

On the other hand, a fluid level detector presented in Patent Document 2 includes a terminal, for electrically connecting a Hall element included in a body as main part to the outside, the terminal being integrally molded with a seal rubber and insert-molded into the body. According to this method, the seal rubber compressively deformed when the body is molded keeps compressed also after molding, generating a surface pressure between the seal rubber and the body. Furthermore, the temperature of the resin increases to high when the body is molded, which causes the seal rubber to adhere tightly to the body. Thus, high sealability is achieved between the seal rubber and the terminal and between the seal rubber and the body.

[Patent Document 1] Japanese Patent No. 4,453,729
[Patent Document 2] Japanese Patent No. 4,089,522

However, the method of performing edging on the metal terminal to increase the creeping distance between the terminal and the housing cannot completely eliminate the gap between the terminal and the housing, so the sealability is incomplete. Furthermore, the method of joining the terminal and the housing limits the material of the terminal and imposes many restrictions to manufacturing, thereby increasing the manufacturing cost.

Furthermore, according to the Patent Document 2, since the body as main part is not screwed onto the electronic device, waterproofing is not performed between the electronic device case and the body. Generally, the waterproof main terminal to be screwed onto the electronic device case requires waterproofing at two locations, or specifically, the O-ring between the case and the housing and a packing between the housing and the terminal. This increases the number of parts and makes fabrication man-hours complicated, thereby increasing the cost.

SUMMARY OF THE INVENTION

In order to solve the above problem, it is an object of the present invention to provide a waterproof main terminal that can prevent fluid front entering an electronic device case and that is inexpensive and allows the number of parts and fabrication man-hours to be reduced.

The waterproof main terminal in accordance with the invention is a waterproof main terminal mounted onto an electronic device case for electrically connecting an electronic component within the case to an external device, including: a terminal that is composed of an elongated metal plate, one end of which is placed into the case via a through hole provided in the case and the other end of which is placed outside the case; a packing that is placed so as to be in tight contact with the whole circumference of the terminal at least on the outside surface side of the case and is integrated with the terminal; and a resin housing that is fixed to a generally central portion in the longitudinal direction of the terminal and includes a flat abutting surface abutting against the outside surface of the case and a screw hole passing through the housing in a direction perpendicular to the abutting surface, wherein the packing is fixed compressed within the housing and includes a seal surface part of which is not covered by the abutting surface of the housing, and a screw is inserted from the outside surface side of the case to the screw hole of the housing, causing the abutting surface to be abutted against the outside surface of the case and the seal surface of the packing to be pressed onto the outside surface of the case, thereby sealing the through hole.

According to the waterproof main terminal in accordance with the invention, when the housing is screwed onto the outside surface of the case, the through hole is sealed with the seal surface of packing pressed onto outside surface of the case, ensuring high waterproofing performance between the case and the housing. Furthermore, the elastic force of the packing placed so as to be in tight contact with the whole circumference of the terminal ensures high waterproofing performance between the terminal and the housing. From the above, the waterproof main terminal can be provided that uses the one packing to perform waterproofing both between the case and the housing and between the terminal and the housing and that is inexpensive and allows the number of parts and fabrication man-hours to be reduced.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

First Embodiment

Figure 1:
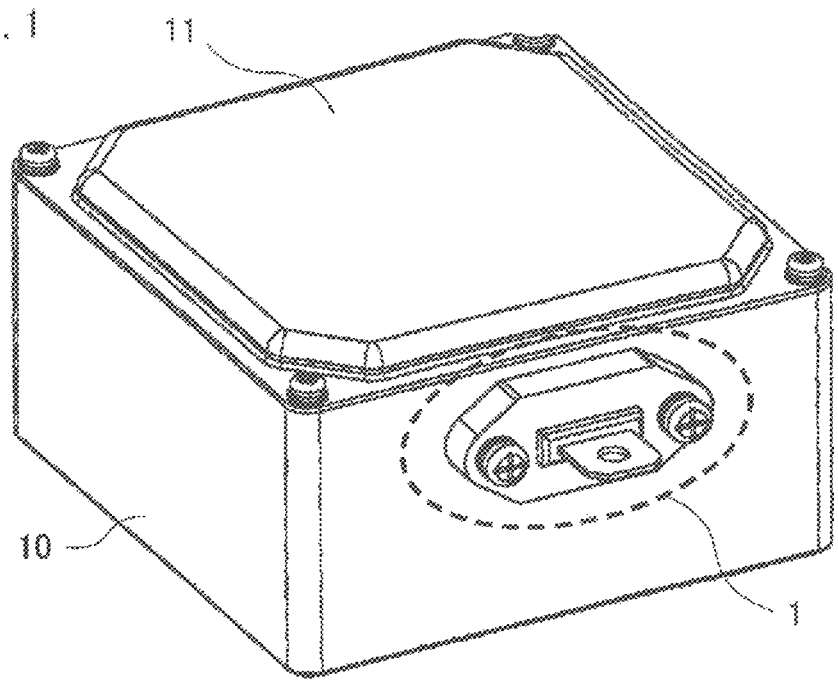
FIG. 1 is a perspective view showing how a waterproof main terminal in accordance with a first embodiment of the invention is used.
Figure 2:
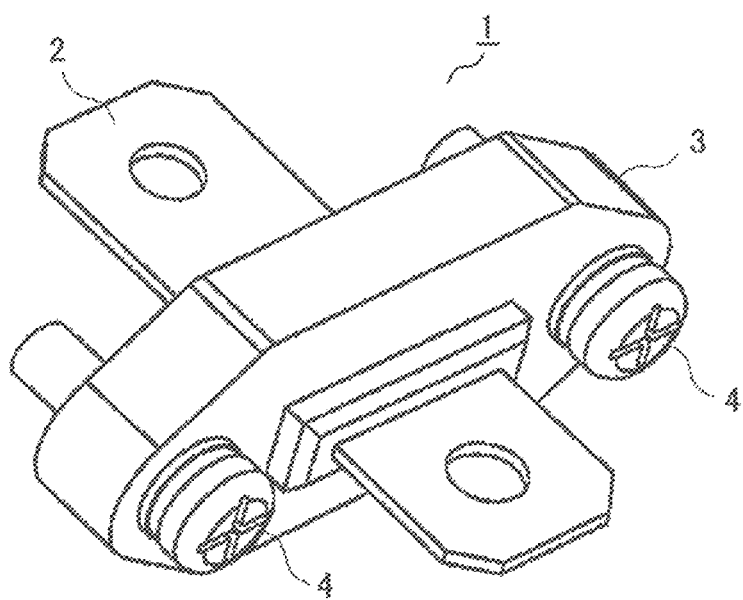
FIG. 2 is a perspective view showing the waterproof main terminal in accordance with the first embodiment of the invention.
Figure 3A:
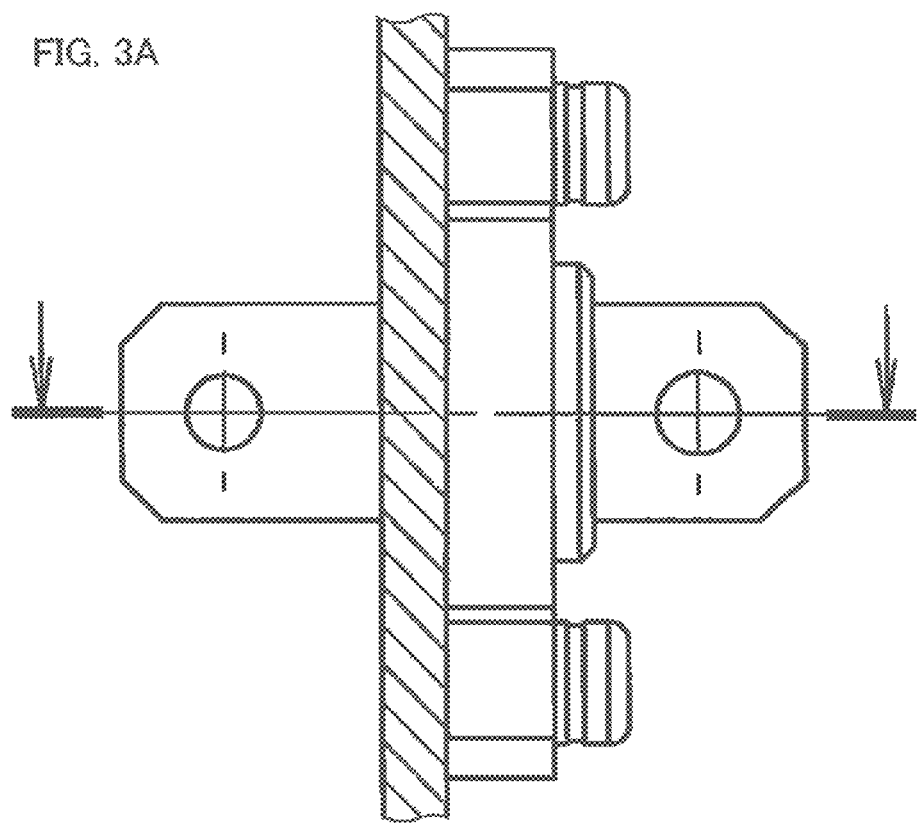
FIG. 3A and FIG. 3B are a top view and a cross-sectional view showing the waterproof main terminal in accordance with the first embodiment of the invention, respectively.
Figure 3B:
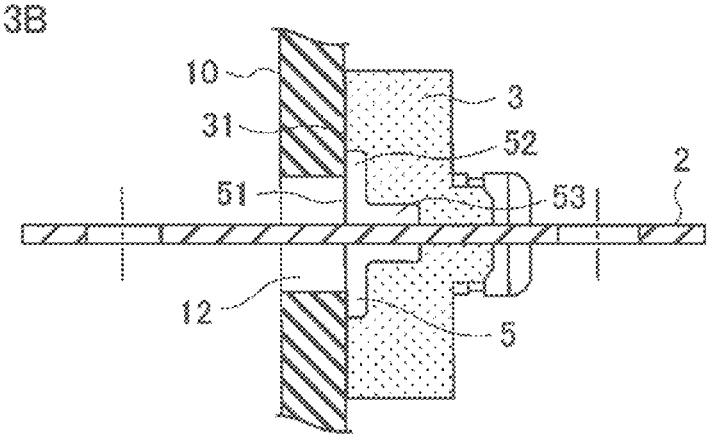

A waterproof main terminal in accordance with a first embodiment of the invention is described below with reference to the drawings. FIG. 1 is a perspective view showing how the waterproof main terminal in accordance with the first embodiment is used. FIG. 2 is a perspective view showing the waterproof main terminal in accordance with the first embodiment. FIG. 3A is a top view showing the waterproof main terminal in accordance with the first embodiment. FIG. 3B is cross-sectional view taken along the line A-A in FIG. 3A. In the figures, the same part is denoted by the same reference numeral.

As shown in FIGS. 1 and 2, a waterproof main terminal 1 is for electrically connecting an electronic component (not shown) contained within an electronic device case 10 and a cover 11 to an external device (not shown) and is mounted onto the electronic device case 10 with a screw 4. Note that the waterproof main terminal 1 is connected to the external device via a harness (not shown).

The configuration of the waterproof main terminal 1 in accordance with the first embodiment is described in detail with reference to FIGS. 3A and 3B. The waterproof main terminal 1 includes a metal terminal 2, a resin housing 3, the screw 4 and a packing 5. The terminal 2 is composed of an elongated metal plate, one end of which is placed into the case 10 via a through hole 12 provided in the case 10 and connected to an electronic component in the case 10. The other end of the terminal 2 is placed outside the case 10 and connected to the external device via the harness.

The packing 5 is placed so as to be in tight contact with the whole circumference of the terminal 2 at least on the outside surface side of the case 10. The packing 5 is composed of a rubber, such as acrylic rubber, and is integrated with the terminal 2.

The housing 3 is composed of a thermoplastic resin, such as polybutylene terephthalate (PBT), and is fixed to a generally central portion in the longitudinal direction of the terminal 2. The housing 3 includes: a flat abutting surface 31 abutting against the outside surface of the case 10; and a screw hole 32 passing through the housing 3 in a direction perpendicular to the abutting surface 31. The packing 5 is fixed compressed within the housing 3 and includes: a seal portion 52 including a seal surface 51 part of which is not covered by the abutting surface 31 of the housing 3; and a convex portion 53 in which the central portion of the seal portion 52 projects along the terminal 2 toward the outside of the case 10.

When the waterproof main terminal 1 is mounted onto the case 10, with one end of the terminal 2 placed into the case 10 via the through hole 12 provided in the case 10, the screw 4 is inserted from the outside surface side of the case 10 to the screw hole 32 of the housing 3, causing the abutting surface 31 of the housing 3 to be abutted against the outside surface of the case 10 and the seal surface 51 of the packing 5 to be pressed onto the outside surface of the case 10, thereby sealing the through hole 12.

Next, the molding steps of the waterproof main terminal 1 is described. First, by primary molding, the packing 5 is molded so as to be in tight contact with the whole circumference of the terminal 2. This integrates the terminal 2 with the packing 5. Next, by secondary molding, the terminal 2 integrated with the packing 5 is insert-molded into the housing 3. This integrates the housing 3 with the packing 5 and the terminal 2.

Figure 4:
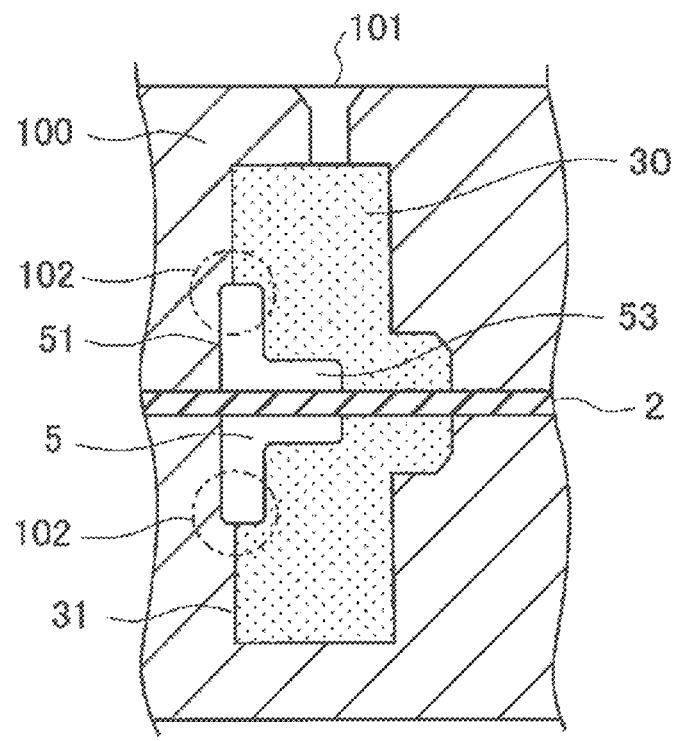
FIG. 4 is a cross-sectional view showing a molding step of the waterproof main terminal in accordance with the first embodiment of the invention.

FIG. 4 shows the secondary molding step. A melted resin 30 that is a material of the housing 3 is poured into a die 100 through a gate 101. The die 100 is in contact with the packing 5 at a die seal portion 102 to perform sealing so as to prevent the poured resin 30 from leaking to the outside. At this time, the injection pressure of the resin 30 causes the convex portion 53 of the packing 5 to be pressed from the surrounding to be compressed. Also, after the secondary molding, when the resin 30 cools down to be solidified and contracted, the packing 5 gets compressed. The elastic force from the thus compressed packing 5 generates a surface pressure between the packing 5 and the housing 3 to provide high adhesion therebetween.

On the other hand, since the temperature of the resin 30 during the secondary molding is around 260° C., the surrounding of the insert-molded packing 5 is likely to melt to generate a gas. When the resin 30 cools down to be solidified with the gas generated from the packing 5 accumulated inside, blow holes and air bubbles are generated between the packing 5 and the housing 3, which may affect the adhesion.

In view of the above, the waterproof main terminal 1 in accordance with this embodiment is removed from the die 100 after the secondary molding. Then, the contraction when the resin 30 cools down to be solidified pushes out the internally accumulated gas from the interface between the packing 5 and the housing 3 corresponding to the position of the die seal portion 102. This prevents a gap due to air bubbles from occurring between the packing 5 and the housing 3, ensuring high adhesion therebetween.

Furthermore, as shown in FIG. 4, the seal surface 51 of the packing 5 is formed higher than the abutting surface 31 of the housing 3 to be exposed. With this, when the abutting surface 31 of the housing 3 is fixed by being abutted against the outside surface of the case 10, the seal surface 51 of the packing 5 is pressed onto the through hole 12 of the case 10 and the outside surface of the case 10 around the through hole 12, allowing the through hole 12 to be reliably sealed.

According to the waterproof main terminal 1 in accordance with the first embodiment, when the housing 3 is fixed onto the outside surface of the case 10 with the screw 4, the through hole 12 is sealed with the seal surface 51 of the packing 5 pressed onto the outside surface of the case 10, ensuring high waterproofing performance between the case 10 and the housing 3. Furthermore, the elastic force of the packing 5 placed so as to be in tight contact with the whole circumference of the terminal 2 ensures high waterproofing performance between the terminal 2 and the housing 3.

From the above, according to the first embodiment, the waterproof main terminal 1 can be provided that uses the one packing 5 to perform waterproofing both between the case 10 and the housing 3 and between the terminal 2 and the housing 3 and that is inexpensive and allows the number of parts and fabrication man-hours to be reduced with respect to waterproof main terminals using a conventional O-ring and packing.

Second Embodiment

A second embodiment of the invention is described with reference to FIGS. 5-10, which is a variation of the waterproof main terminal 1 in accordance with the first embodiment. Note that, in the figures, the same or corresponding part is denoted by the same reference numeral and is not described.

Figure 5:
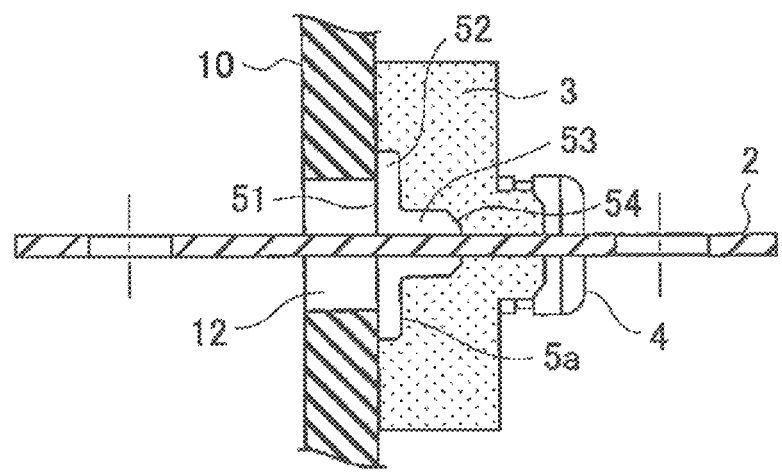
FIG. 5 is a cross-sectional view showing a waterproof main terminal in accordance with a second embodiment of the invention.

A packing 5a shown in FIG. 5 includes: a seal portion 52 including a seal surface 51; a convex portion 53 in which the central portion of the seal portion 52 projects along a terminal 2 toward the outside of a case 10; and a sloping surface 54 on the top of the convex portion 53. With the sloping surface 54 provided, when a housing 3 is screwed onto the case 10, a diagonal force is applied to the sloping surface 54 in contact with the housing 3, which pushes the packing 5a onto the terminal 2. Thus, high waterproofing performance is ensured between the terminal 2 and the housing 3.

The packing 5a having the sloping surface 54 shown in FIG. 5 is effective when the waterproofing performance between the terminal 2 and the housing 3 is insufficient for the requirement. For example, it is applicable when a gas is generated from the packing 5a during the secondary molding of the housing 3 and the contraction pressure of the housing 3 is insufficiently applied to the packing 5a or when the waterproofing performance requirement is too high for the contraction pressure of the housing 3 alone.

Figure 6:
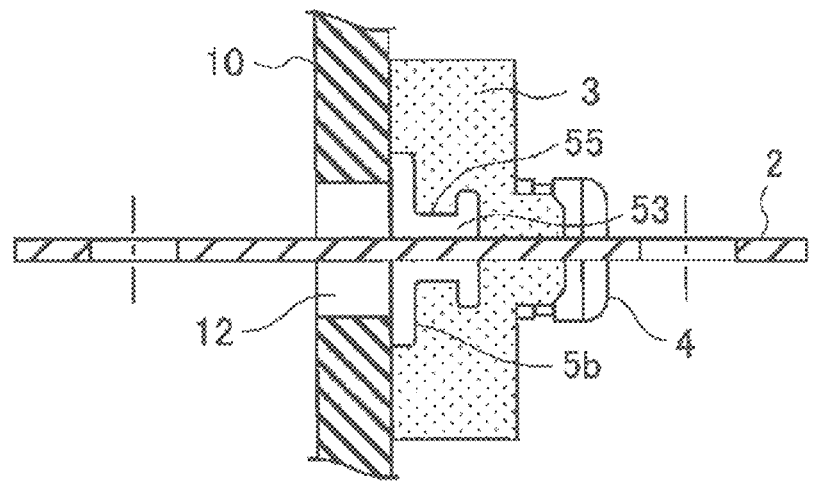
FIG. 6 is a cross-sectional view showing the waterproof main terminal in accordance with the second embodiment of the invention.

Alternatively, a packing 5b shown in FIG. 6 includes a groove 55 on the cylindrical surface of the convex portion 53, causing the convex portion 53 to be T-shaped. This shape causes a resin to wrap around the groove 55 during the secondary molding of the housing 3 to enhance the adhesion to the housing 3 by an anchor effect. Furthermore, with the injection pressure of the resin during the secondary molding reliably applied to the groove 55, the resin cools down to be solidified and contracted, which ensures high waterproofing performance between the terminal 2 and the housing 3.

With the waterproof main terminal 1 employing the packing 5b having such a groove 55, even when the waterproof main terminal 1 is externally impacted by falling or the like before being mounted onto the case 10, the terminal 2 integrated with the packing 5b can be prevented from falling out of the housing, by virtue of high adhesion between the packing 5b and the housing 3. Note that a pit may be provided in place of the groove 55 as a structure for achieving the anchor effect.

Figure 7:
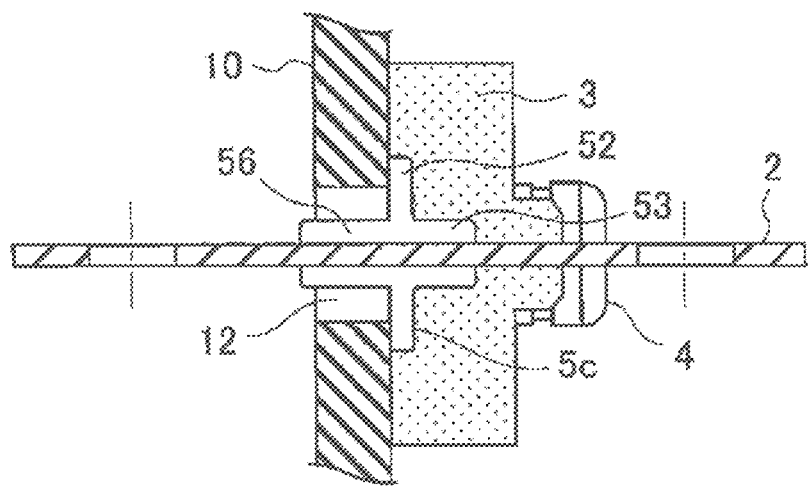
FIG. 7 is a cross-sectional view showing the waterproof main terminal in accordance with the second embodiment of the invention.

Alternatively, a packing 5c shown in FIG. 7 includes a second convex portion 56 in which the central portion of a seal portion 52 projects along a terminal 2 toward the inside of a case 10. The packing 5c projecting toward the inside of the case 10 in this way ensures the insulation between the terminal 2 and the case 10 when the case 10 is made of a metal, such as aluminum. Although increase in cost due to increase in the volume of the packing 5c may be a concern, since a rubber has a high withstand voltage, the second convex portion 56 can provide high insulation performance even when the second convex portion 56 is thin. Thus, this can reduce the cost with respect to adding an insulating component. Note that a configuration including two or more of the sloping surface 54, the groove 55 and the second convex portion 56 shown in FIGS. 5 to 7 may be used.

Figure 8B:
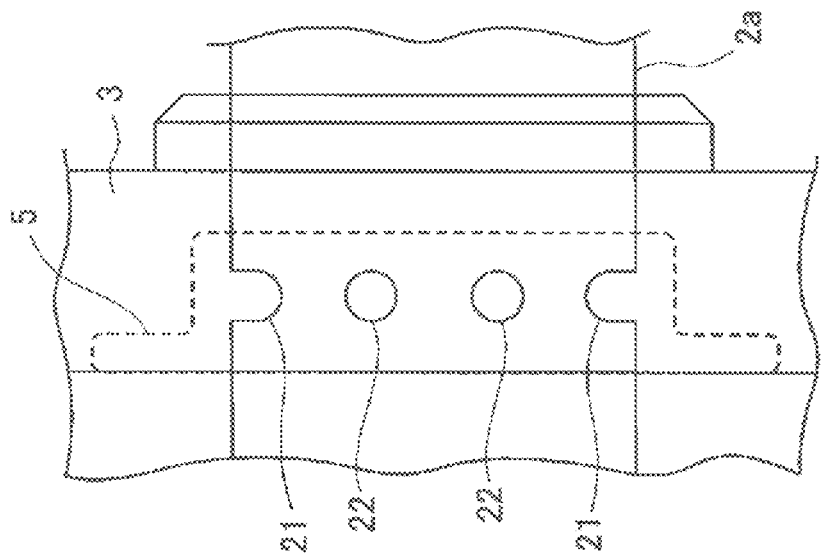
FIG. 8A and FIG. 8B are a top view and a partial enlarged view showing the waterproof main terminal in accordance with the second embodiment of the invention, respectively.
Figure 8A:
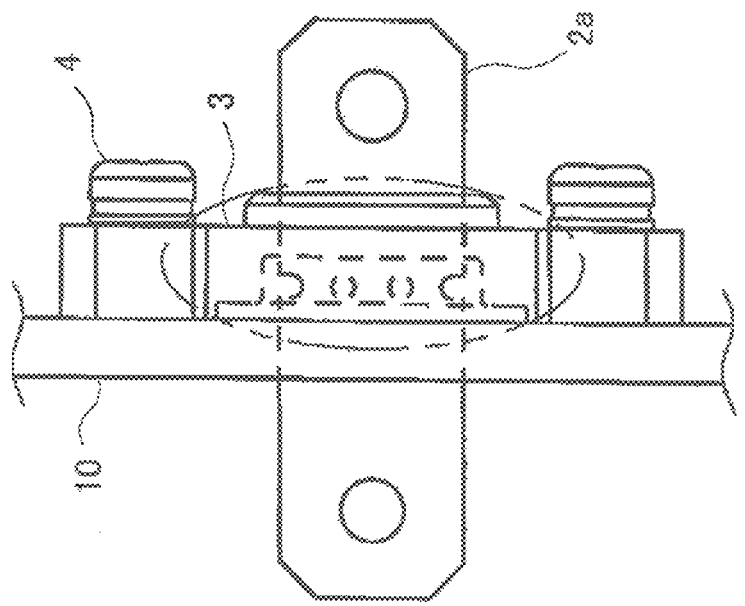
Figure 9:
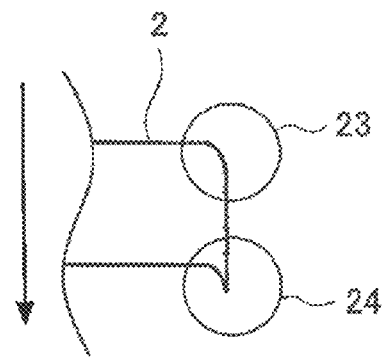
FIG. 9 shows a comparison example of the terminal of the waterproof main terminal in accordance with the second embodiment of the invention.

FIG. 8A is a top view showing the waterproof main terminal 1 in accordance with the second embodiment viewed from the upward direction. FIG. 8B is an enlarged view of the part enclosed by an ellipse in FIG. 8A. A terminal 2a shown in FIGS. 8A and 8B include a notch 21 and a hole 22 in an area to be integrated with the packing 5. Note that any one of the notch 21 and the hole 22 may also be included.

The terminal 2a including the notch 21 and the hole 22 enhances the adhesion to the packing 5 by the anchor effect to provide an effect of preventing the packing 5 from falling. Also, the packing 5 can be placed at a predetermined position without being deviated from the position by the injection pressure of the resin during the secondary molding. Note that a protrusion may be provided in place of the notch 21 and the hole 22 as a structure for achieving the anchor effect.

When the terminal 2 is wired, the edge of the terminal 2 may be left rough-edged. Also, as shown by a comparison example in FIG. 9, when the terminal 2 is pressed, a sagging 23 and a burr 24 may occur on the upper and lower sides of the press direction (shown by an arrow in FIG. 9), respectively. When the edge portion of the terminal 2 is sharp-edged, the overall contraction of the packing 5 may be non-uniform to generate a gap depending on the direction and condition of the injection pressure of the resin of the housing 3 during the secondary molding.

Figure 10:
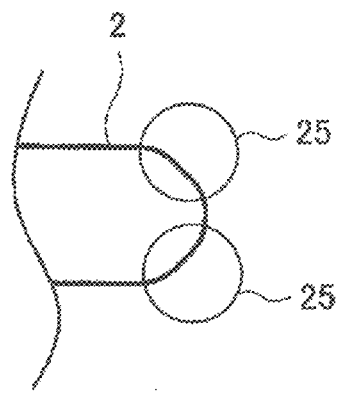
FIG. 10 shows the terminal of the waterproof main terminal in accordance with the second embodiment of the invention.

Thus, as shown in FIG. 10, the edge portion of the terminal 2 is desirably chamfered 25. Chamfering 25 the edge portion of the terminal 2 uniformizes the injection pressure of the resin of the housing 3 applied to the whole packing 5 and the contraction pressure when the resin cools down to be solidified to achieve uniform contraction, thereby ensuring the waterproofing performance between the packing 5 and the housing 3.

According to the second embodiment, the waterproof main terminal 1 can be provided in which, in addition to the same effect as that of the first embodiment, the adhesion between the packing and the terminal or between the packing and the housing is enhanced to ensure further high waterproofing performance by improving the shape of the packing and the terminal.

Third Embodiment

Figure 11:
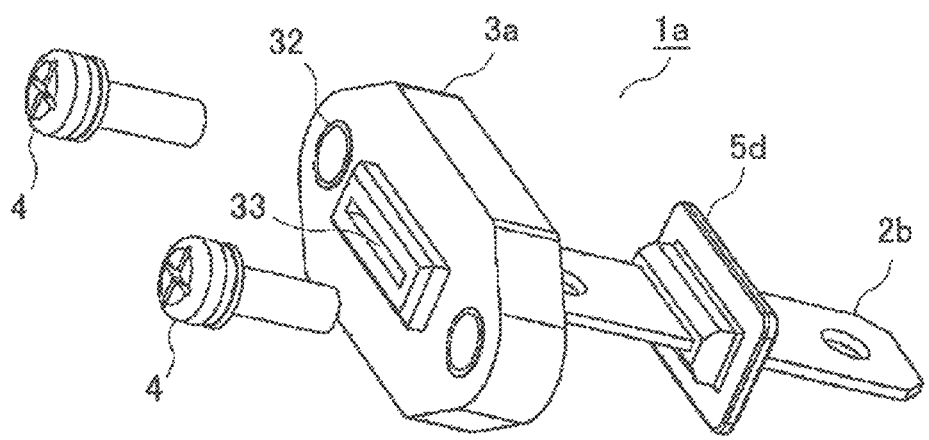
FIG. 11 is an exploded perspective view showing a part composition of a waterproof main terminal in accordance with a third embodiment of the invention.
Figure 12:
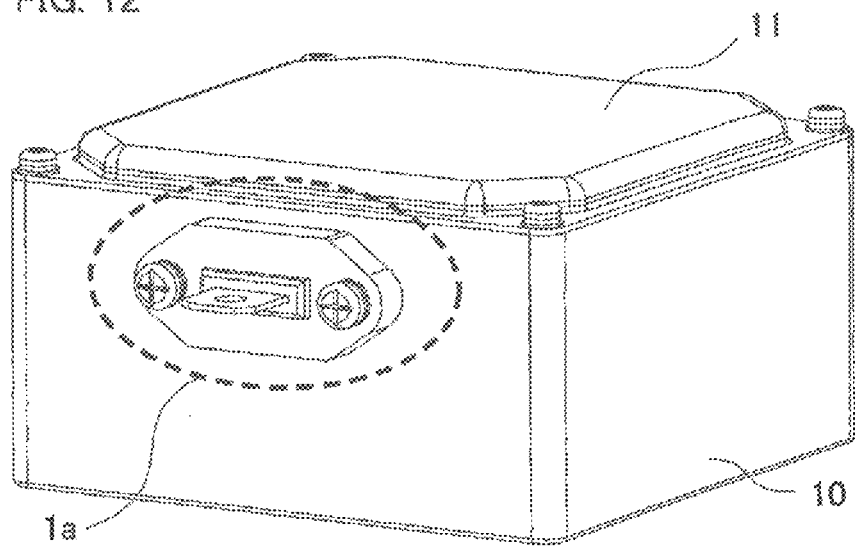
FIG. 12 is a perspective view showing how the waterproof main terminal in accordance with the third embodiment of the invention is used.

FIG. 11 shows a part composition of a waterproof main terminal in accordance with a third embodiment of the invention. FIG. 12 shows how the waterproof main terminal in accordance with the third embodiment is used. Note that, in the figures, the same or corresponding part is denoted by the same reference numeral and is not described.

As shown in FIG. 11, a waterproof main terminal 1a in accordance with the third embodiment has a housing 3a that includes: a concave portion (not shown) to which a packing 5d is abutted and compressed; and a hole for terminal 33 passing through the bottom surface of the concave portion. In the thus configured housing 3a, a terminal 2b integrated with the packing 5d is inserted into the hole for terminal 33 and the packing 5*d* is compressed in the concave portion to fix the packing 5*d* and the terminal 2*b* to the housing 3*a*.

As shown in FIG. 12, the waterproof main terminal 1*a* in accordance with the third embodiment is used in the same way as the first embodiment, mounted onto a electronic device case 10 with a screw. The fabrication is performed by, first, mounting the housing 3*a* onto the terminal 2*b* integrated with the packing 5*d*, and then, screwing the housing 3*a* onto the case 10.

Figure 13:
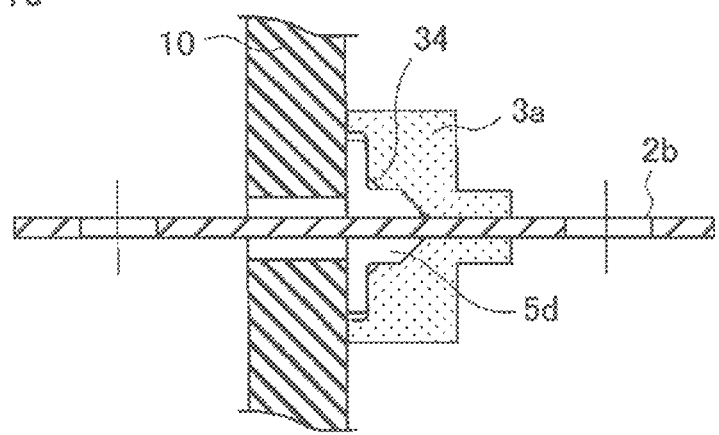
FIG. 13 is a cross-sectional view showing the waterproof main terminal in accordance with the third embodiment of the invention.

With the housing 3*a* screwed onto the case 10, as shown in FIG. 13, a load from the screw causes the sloping surface of a concave portion 34 of the housing 3*a* to be in contact with the packing 5*d* to apply a diagonal force to the packing 5*d*. This pushes the packing 5*d* to the terminal 2*b* to be compressed.

According to the third embodiment, the same effect as that of the first embodiment is achieved, and further, the packing 5*d* can absorb the variation in the gap due to the difference of linear expansion coefficient between the terminal 2*b* and the housing 3*a*. Furthermore, improving the shape of the packing 5*d* and the terminal 2*b* of the waterproof main terminal 1*a* in accordance with the third embodiment as with the second embodiment provides the same effect as that of the second embodiment.

Fourth Embodiment

Figure 14:
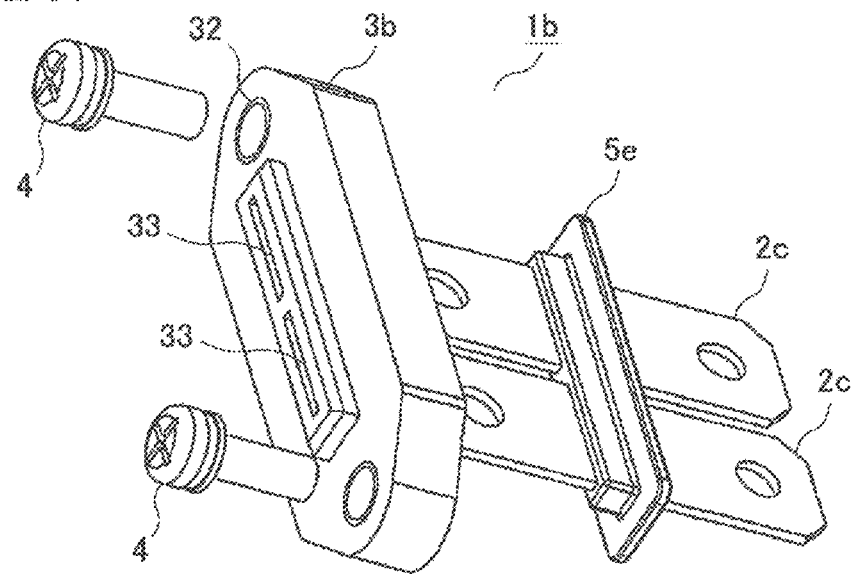
FIG. 14 is an exploded perspective view showing a part composition of a waterproof main terminal in accordance with a fourth embodiment of the invention.
Figure 15:
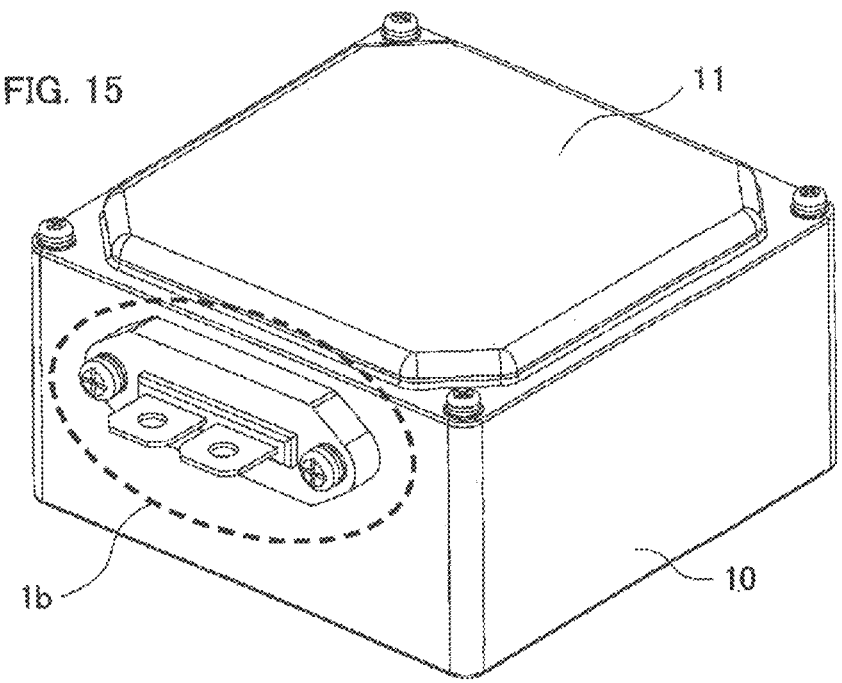
FIG. 15 is a perspective view showing how the waterproof main terminal in accordance with the fourth embodiment of the invention is used.

FIG. 14 shows a part composition of a waterproof main terminal in accordance with a fourth embodiment of the invention. FIG. 15 shows how the waterproof main terminal in accordance with the fourth embodiment is used. Note that, in the figures, the same or corresponding part is denoted by the same reference numeral and is not described. In the first to third embodiments, one main terminal is used. On the other hand, in the fourth embodiment, a plurality of terminals are integrated with one packing while being insulated from one another, which are fixed to one housing, in order to accommodate the case in which a plurality of main terminals are needed.

As shown in FIG. 14, a waterproof main terminal 1*b* in accordance with the fourth embodiment has a housing 3*b* that includes: a concave portion (not shown) to which a packing 5*e* is abutted and compressed; and two holes for terminal 33 passing through the bottom surface of the concave portion. In the thus configured housing 3*b*, two terminals 2*c* integrated with a packing 5*e* are inserted into the respective holes for terminal 33 and the packing 5*e* is compressed in the concave portion to fix the packing 5*e* and the two terminals 2*c* to the housing 3*b*.

As shown in FIG. 15, the waterproof main terminal 1*b* in accordance with the fourth embodiment is used in the same way as the first embodiment, mounted onto a electronic device case 10 with a screw. The fabrication is performed by, first, mounting the housing 3*b* onto the two terminals 2*c* integrated with the packing 5*e*, and then, screwing the housing 3*b* onto the case 10. Note that, in the fourth embodiment, the waterproof main terminal 1*b* including the two terminals 2*c* is used as an example, however three or more terminals may be used.

Furthermore, in the fourth embodiment, the packing 5*e* is compressed in the concave portion of the housing 3*b* to fix the packing 5*e* and the two terminals 2*c* to the housing 3*b*, however, the two terminals 2*c* integrated with the packing 5*e* may be insert-molded into the housing 3*b* as with the first embodiment.

According to the fourth embodiment, the waterproof main terminal 1*b* including the plurality of main terminals achieves the same effect as that of the first embodiment. Furthermore, improving the shape of the packing 5*e* and the terminals 2*c* of the waterproof main terminal 1*b* in accordance with the fourth embodiment as with the second embodiment provides the same effect as that of the second embodiment. Note that the embodiments of the invention may be freely combined or appropriately modified or omitted within the scope of the invention.

Various modifications and alterations of this invention will be apparent to those skilled in the art without departing from the scope and spirit of this invention, and it should be understood that this invention is not limited to the illustrative embodiments set forth herein.

What is claimed is:

1. A waterproof main terminal mounted onto an electronic device case for electrically connecting an electronic component within the case to an external device, comprising:
    a terminal that is composed of an elongated metal plate, one end of which is placed into the case via a through hole provided in the case and the other end of which is placed outside the case;
    a packing that is placed so as to be in tight contact with the whole circumference of the terminal at least on the outside surface side of the case and is fixed to the terminal; and
    a resin housing that is fixed to a generally central portion in the longitudinal direction of the terminal and includes a flat abutting surface abutting against the outside surface of the case and a screw hole passing through the housing in a direction perpendicular to the abutting surface, wherein
    the packing is fixed compressed within the housing and includes a seal surface part of which is not covered by the abutting surface of the housing, and
    a screw is inserted from the outside surface side of the case to the screw hole of the housing, causing the abutting surface to be abutted against the outside surface of the case and the seal surface of the packing to be pressed onto the outside surface of the case, thereby sealing the through hole.

2. The waterproof main terminal according to claim 1, wherein, when the housing is molded, the terminal fixed to the packing is insert-molded into the housing to integrate the housing with the packing and the terminal.

3. The waterproof main terminal according to claim 1, wherein the housing includes:
    a concave portion to which the packing is abutted and compressed; and
    a hole for terminal passing through the bottom surface of the concave portion, and
    the terminal fixed to the packing is inserted into the hole for terminal and the packing is compressed in the concave portion to fix the packing and the terminal to the housing.

4. The waterproof main terminal according to claim 1, wherein the packing includes:
    a seal portion including the seal surface; and
    a convex portion in which the central portion of the seal portion projects along the terminal toward the outside of the case.

5. The waterproof main terminal according to claim 4, wherein the packing includes a sloping surface on the top of the convex portion.

6. The waterproof main terminal according to claim 4, wherein the packing includes a pit or groove on the cylindrical surface of the convex portion.

7. The waterproof main terminal according to claim 4, wherein the packing includes a second convex portion in which the central portion of the seal portion projects along the terminal toward the inside of the case.

8. The waterproof main terminal according to claim 1, wherein the terminal includes one or both of a hole and a notch in an area to be fixed to the packing.

9. The waterproof main terminal according to claim 1, wherein the edge portion of the terminal is chamfered.

10. The waterproof main terminal according to claim 1, comprising a plurality of terminals, the plurality of terminals being fixed to the one packing while being insulated from one another, which are further fixed to the one housing.

11. The waterproof main terminal according to claim 1, wherein the terminal is connected to an external device via a harness.

* * * * *